United States Patent [19]
Lee et al.

[11] Patent Number: 5,565,084
[45] Date of Patent: Oct. 15, 1996

[54] ELECTROPOLISHING METHODS FOR ETCHING SUBSTRATE IN SELF ALIGNMENT

[75] Inventors: Ho J. Lee; Hi D. Lee; Jae D. Lee; Jun B. Yoon; Chul H. Han; Choong K. Kim, all of Daejeon; Doo W. Seo, Seoul, all of Rep. of Korea

[73] Assignee: Qnix Computer Co., Ltd., Seoul, Rep. of Korea

[21] Appl. No.: 478,732

[22] Filed: Jun. 7, 1995

[30] Foreign Application Priority Data

Oct. 11, 1994 [KR] Rep. of Korea ........................ 94-26014

[51] Int. Cl.$^6$ .................................. C25F 3/12; C25F 3/30
[52] U.S. Cl. ........................ 205/646; 205/656; 205/665; 205/666; 205/674
[58] Field of Search .......................... 204/129.55, 129.65, 204/129.75, 129.95; 205/646, 656, 665, 666, 674

[56] References Cited

U.S. PATENT DOCUMENTS 5,139,624  8/1992  Searson et al. ...................... 204/129.3

*Primary Examiner*—Donald R. Valentine
*Attorney, Agent, or Firm*—Keck, Mahin & Cate

[57] ABSTRACT

Disclosed are electropolishing methods for etching a substrate in self alignment. A hole is formed in a substrate in self alignment by using an electropolishing system, wherein a reaction tube, an etchant solution, an electrode, a constant current source and the silicon substrate, said etchant solution being contained in a space confined by the reaction tube and the substrate, which is attached to one end of the reaction tube in such a way that the bottom of the substrate may be toward the interior of the space, said constant current source being connected with a metal layer formed on the substrate and the electrode. The substrate is made to be porous by flowing a constant current and etched by the action of the etchant solution while breaking the current. In addition to being economical, the methods can determine the position and size of the hole accurately and precisely. Further, neither chemical damage nor mechanical impact is generated on the substrate.

26 Claims, 12 Drawing Sheets

ELECTROPOLISHING METHODS FOR ETCHING SUBSTRATE IN SELF ALIGNMENT

BACKGROUND OF THE INVENTION

1. Field of the Invention

The present invention relates, in general, to methods for etching a substrate in self alignment and, more particularly, to use of an electropolishing system employing a constant current and a chemical etchant.

2. Description of the Prior Art

Sometimes, development in micromachine technology has partly been based on a silicon etch process for fine structure. For example, in an ink jet printer, such as that manufactured by Hewlett Packard Co. Ltd., a printer head is provided with a substrate having holes which aim to supply ink from an ink reservoir to an ink nozzle. Another example is a microaccelerometer for auto airbag, which measures an acceleration upon impact by sensing a distortion of cantilever. In the microaccelerometer, a base portion for cantilever and its circumferential substrate must be eliminated, in order to secure a sufficient vibration amplitude of the cantilever. Such holes in the substrate are ordinarily formed in the last step of the process, therefor. The reason is as follows.

Photolithography is necessarily required to determine a fine pattern. If the holes of the substrate were formed in the initial or middle steps of the process, a photosensitive film might nonuniformly be coated due to the surface tension generated at the brink of the hole. Accordingly, it might be virtually impossible to form a pattern for a subsequent structure. This order limitation in the hole formation results in setting limits to the formation method of hole, thus deteriorating the quality of the resulting hole. In addition, the production cost of the fine structure rises, but the performance thereof is lowered.

Following are of the detailed reasons for the conventional problems. Generally, a silicon substrate is etched using calcium hydroxide or a mixture solution consisting of ethylene diamine, pyrocatechol and water or of hydrofluoric acid, nitric acid and acetic acid. These chemicals are able to etch silicon substrates only at a rate of several microns per minute. For the formation of holes, silicon substrates thus should be immersed in the chemicals for several hours. However, the chemicals may destroy other ready-formed structures because of their strong corrosive action. Therefore, it is required that the silicon substrate is additionally pre-treated to protect the ready-formed structures, in advance of forming the holes in the silicon substrate by use of the chemicals.

Another principal problem of the prior arts is that it is very difficult to accurately determine the final size of the holes in the upper surface of the substrate as the silicon substrate is considerably thick, for example, about 500 microns thick. In addition, due to a fact that the formation of holes starts at the bottom of the silicon substrate, there is undertaken complicated yet coarse processes that an infrared alignmeter is used or an alignment pattern should be previously placed on the bottom of the substrate, in order to align the holes with other ready-formed structures.

To solve the above-mentioned problems, Hewlett Packard Co., Ltd. has made an attempt to use laser drilling and sand impact on the upper surface of the substrate to form holes in the substrate. However, there are still disadvantages, such as inevitable dust generation and thermal and mechanical impact on the substrate. In addition, the Hewlett Packard's method is unable to form fine holes in the silicon substrate. Furthermore, no structure can be formed in an area which is destined to have holes. And, the laser equipment is expensive, which has an adverse influence on the production cost.

SUMMARY OF THE INVENTION

It is therefore a primary object of the present invention to provide an electropolishing method for etching a substrate in self alignment, economical in forming a fine structure of substrate.

It is another object of the present invention to provide an electropolishing method for etching a substrate in self alignment, easy in processing.

It is a further object of the present invention to provide an electropolishing method for etching a substrate in self alignment, protective of damaging the substrate chemically and mechanically.

It is still another object of the present invention to provide an electropolishing method for etching a substrate in self alignment, capable of determining the position and size of holes accurately.

In accordance with a view of the present invention, there is provided an electropolishing method for etching a substrate in self alignment, comprising the steps of: establishing an insulation film pattern by forming an insulation film on a substrate and selectively etching the insulation film, a predetermined area of the substrate being exposed through the insulation film pattern; implanting ions into the predetermined area of the substrate, to form an ion-doped layer; sequentially forming a metal layer and a predetermined material layer over the resulting structure; forming a hole by making an area of the substrate porous in an electropolishing system and etching the porous area, said electropolishing system consisting of a reaction tube, an etchant solution, an electrode, a constant current source and the silicon substrate, wherein said etchant solution is contained in a space confined by the reaction tube and the substrate, which is attached to one end of the reaction tube in such a way that the bottom of the substrate may be toward the interior of the space, said constant current source being connected with the metal layer of the substrate and the electrode; and eliminating any one of the metal layer and the material layer from the substrate, to obtain a membrane consisting of the other layer thus left.

In another view of the present invention, there is provided an electropolishing method for etching a substrate in self alignment, comprising the steps of: establishing a window by forming an insulation film on a substrate and selectively etching the insulation film, a predetermined area of the substrate being exposed through the window; implanting ions into the exposed area of the substrate, to form an ion-doped layer; sequentially forming a first metal layer and a second metal layer over the resulting structure; forming a sacrificial layer in such a pattern as to cover the window, in part; forming a third metal layer over the resulting structure; opening an area of the third metal layer to form an aperture over the pattern of the sacrificial layer; forming a hole by making an area of the substrate porous in an electropolishing system and etching the porous area in such a way to expose an area of the first metal layer, said electropolishing system consisting of a reaction tube, an etchant solution, an electrode, a constant current source and the silicon substrate, wherein said etchant solution is contained in a space confined by the reaction tube and the substrate which is attached to one end of the reaction tube in such a way that the bottom of the substrate may be toward the interior of the space, said constant current source being connected with the first and the second metal layers of the substrate and the electrode; and eliminating the exposed area of the first metal layer, the second metal layer within the hole and the sacrificial layer from the substrate, to obtain a membrane consisting of the other layer thus left.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF PREFERRED EMBODIMENTS

Figure 1A:
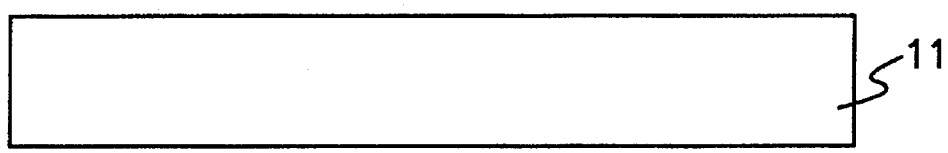
FIGS. 1A through 1F are schematic cross sectional views showing an electropolishing method for etching a silicon substrate in self alignment, according to an embodiment of the present invention.

Hereinafter, the application of the preferred embodiments of the present invention is best understood with reference to the accompanying drawings, wherein like reference numerals are used for like and corresponding parts, respectively.

Referring initially to FIGS. 1A through 1F, there is shown an electropolishing method for etching a silicon substrate in self alignment, according to an embodiment of the present invention.

First, FIG. 1A shows a p type silicon substrate 11.

Figure 1B:
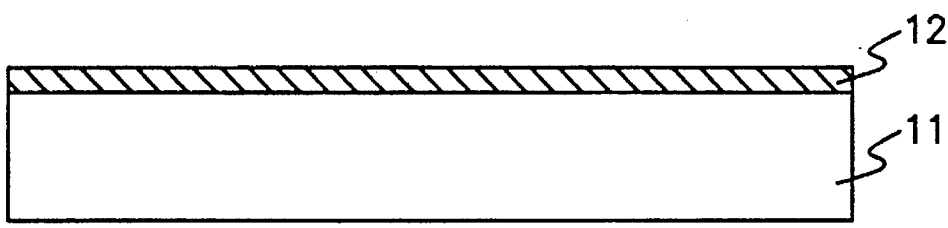

FIG. 1B is a cross section of the silicon substrate after an oxide film 12 is grown to a thickness of about 0.5 to 1.5 microns on the p type silicon substrate 11. Instead of oxide film, an insulation film, such as a silicon nitride film, a silicon carbide film, a photosensitive film or a polymeric film, may be employed.

Figure 1C:
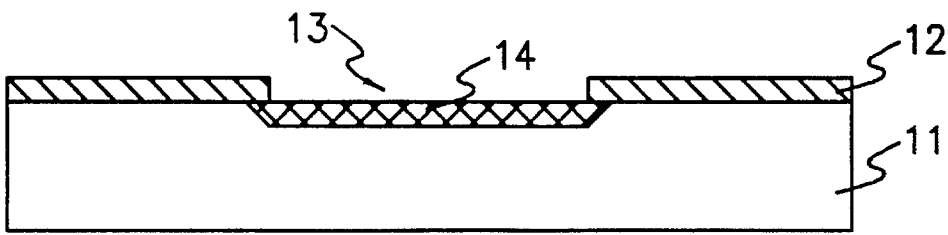

FIG. 1C is a cross section of the silicon substrate after the oxide film is partly removed to form a window 13 with an area of about 4 mm×4 mm or about 5 mm×5 mm, followed by formation of a boron-doped layer 14 in the silicon substrate 11. The boron-doped layer 14 is 2000 Angstroms to 2 microns thick and is formed by implanting boron at a dose of about $1\times10^{18}$ to $5\times10^{20}/cm^3$ with the remaining oxide film 12 serving as a mask.

Figure 1D:
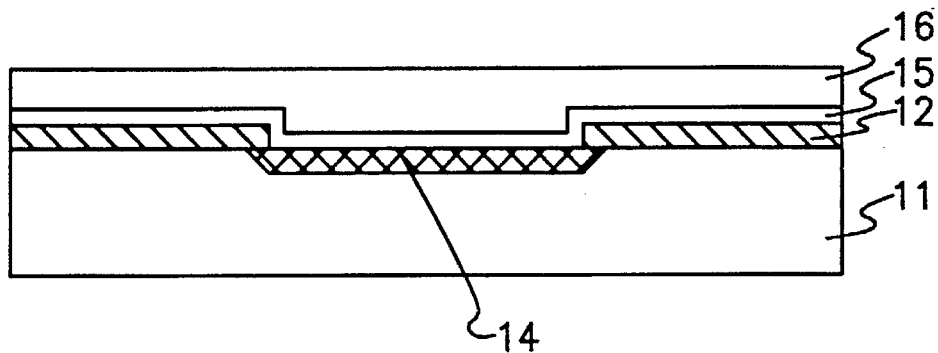

FIG. 1D is a cross section of the substrate after a metal layer of gold or platinum 15 with a thickness of about 1000 to about 2000 Angstroms deposited over the entire surfaces of the resulting structure, followed by formation of a blanket sacrificial layer 16 on the metal layer 15. The sacrificial layer 16 is made of photosensitive solutions, polymers or paraffin.

Figure 1E:
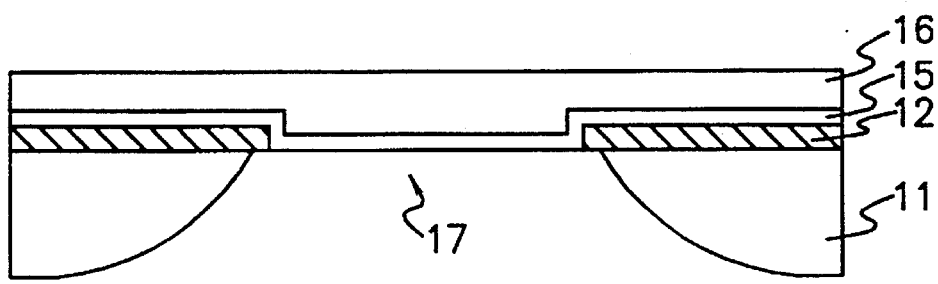

FIG. 1E is a cross section of the substrate after a hole 17 is formed in the silicon substrate 11 by use of an electropolishing process, according to the present invention. This electropolishing will be described in detail below.

Figure 1F:
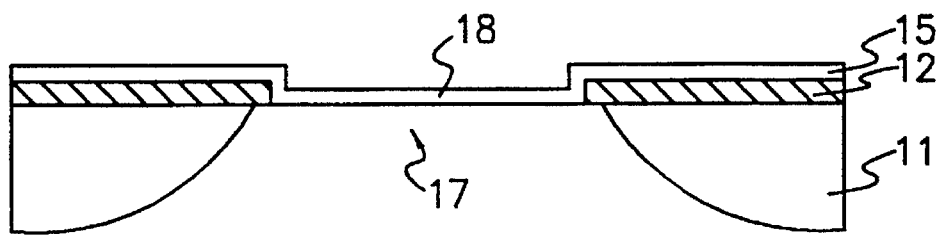

FIG. 1F is a cross section of the substrate after the sacrificial layer 16 is taken off to obtain a gold or platinum membrane 18 with a predetermined area.

In the above embodiment of the present invention, where a metal, such as nickel, chrome, tungsten, titanium, tantalum or copper, is employed in lieu of the sacrificial layer 15, elimination of the gold or platinum can give a membrane consisting of the metal film.

Figure 2:
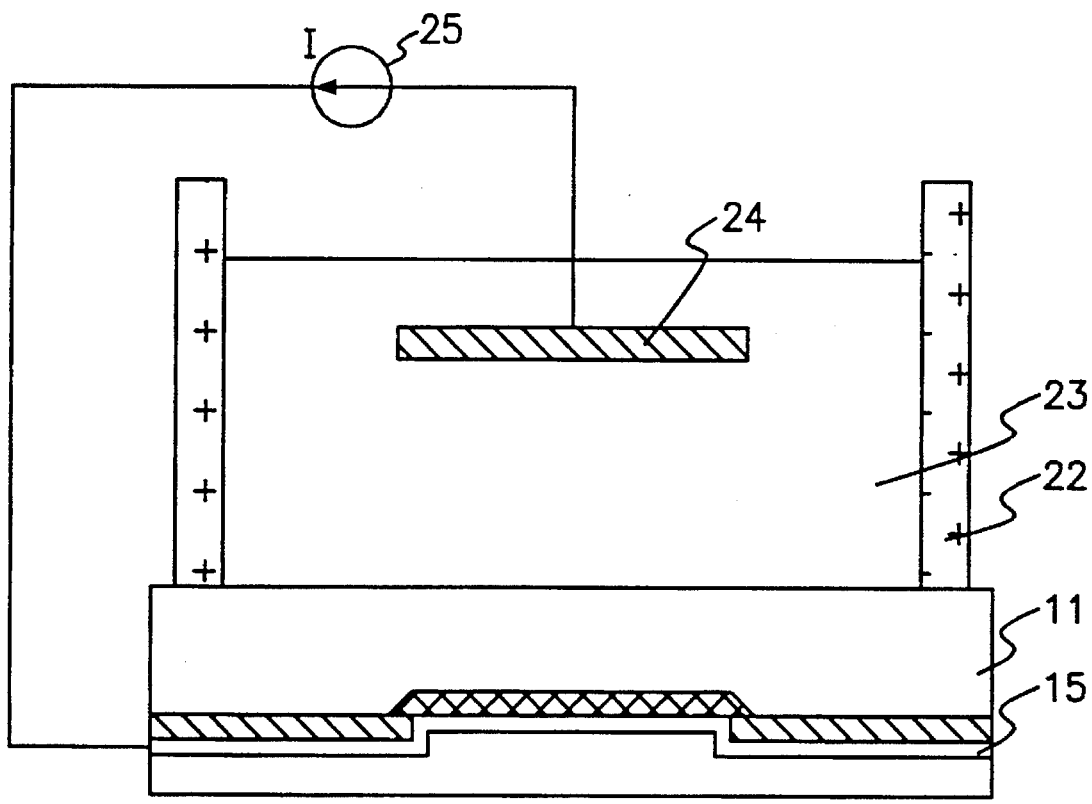
FIG. 2 is a schematic view showing an electropolishing system, according to the present invention.

Referring to FIG. 2, there is illustrated an electropolishing system useful to form holes in a silicon substrate, according to the present invention. As shown in this figure, the electropolishing system of the present invention consists of a teflon reaction tube 22, an etchant solution 23, a platinum electrode 24, connected with a constant current source 25, and the silicon substrate 11 to be electropolished. In this electropolishing system, the etchant solution 23 is comprised of 2 volumes of 24 wt. % hydrofluoric acid per volume of 70 wt. % nitric acid and is placed in a space confined by the reaction tube 22 and the silicon substrate 11 which is attached to one end of the reaction tube 22 by paraffin in such a way that the silicon may be the bottom of the space.

For electropolishing the silicon substrate 11 of FIG. 1D, the platinum electrode 24 is immersed in the etchant solution 22 and connected through the constant current source 25 with the gold coated on the silicon substrate 11. While the platinum electrode 24 and the gold are an anode and a cathode, respectively, a current of about 3 A is supplied for 1 minute. As a result, the hydrofluoric acid in the etchant solution makes the silicon substrate 11 porous or electropolished. Thereafter, a break in the supply of electricity causes the solution to etch the porous silicon substrate 11 for 1 minute. Then, a current of about 3 A is applied to the electrodes for 1 minute, to make the silicon substrate 11 porous or electropolished, again. This silicon substrate 11 is further etched by breaking the supply of the electricity for 1 minute. Such electrical supply and break operations are repeated until a hole is formed. The porous reaction or electropolishing is more rapidly generated in an area with more current density.

In this regard, a chemical reaction procedure of forming the hole in the silicon substrate will be described in detail with reference to FIGS. 3A through 3G.

Figure 3A:
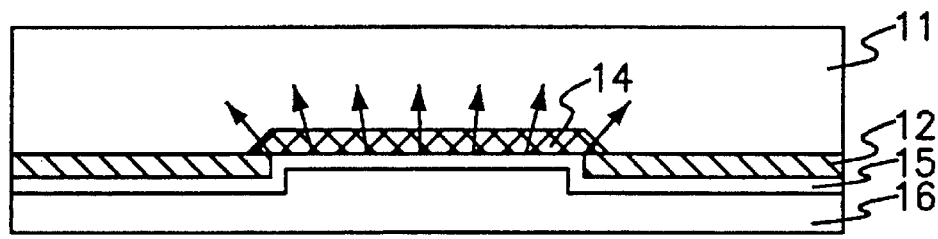
FIGS. 3A through 3G are schematic cross sectional views showing chemical reaction procedures for the formation of hole in a silicon substrate.

First, FIG. 3A shows the silicon substrate of FIG. 2.

Figure 3B:
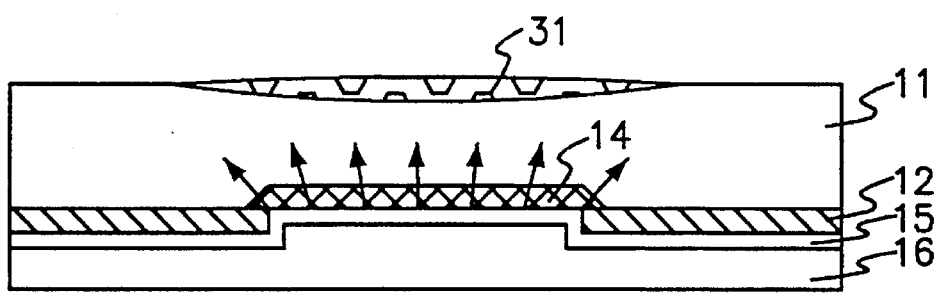

Next, FIG. 3B shows a porous silicon layer 31 which is made irrespective of position in the silicon substrate by application of a constant current to the electropolishing system of FIG. 2.

Figure 3C:
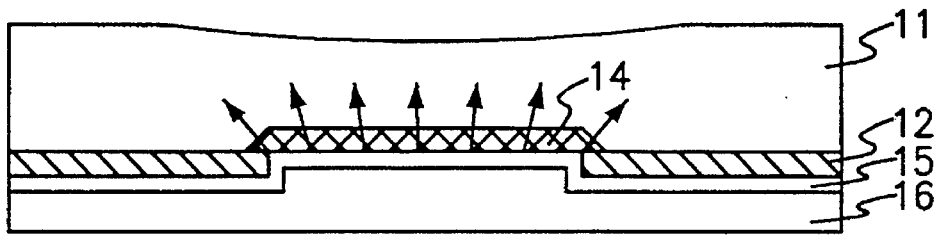

Thereafter, the supply of the constant current is broken and then, the etchant solution works to etch the porous silicon layer 31, as shown in FIG. 3C.

Figure 3D:
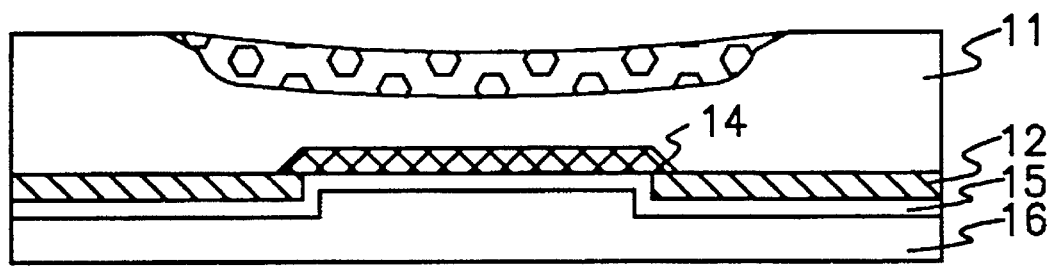

FIG. 3D shows another porous silicon layer which is formed after a constant current is again applied to the electropolishing system. As shown in this figure, the silicon substrate is made to be rapidly porous over the window.

Figure 3E:
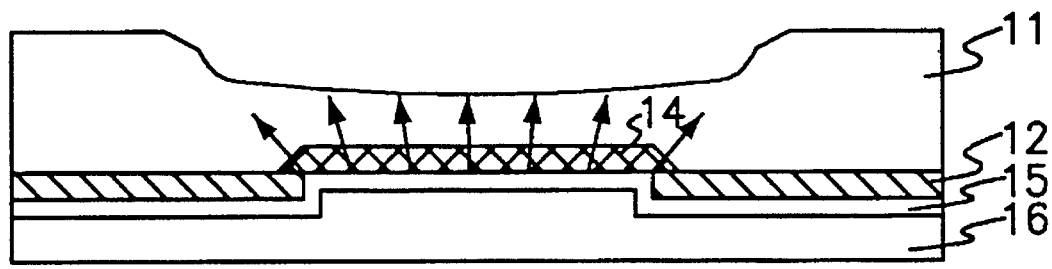

FIG. 3E shows the same condition as in FIG. 3C.

Figure 3F:
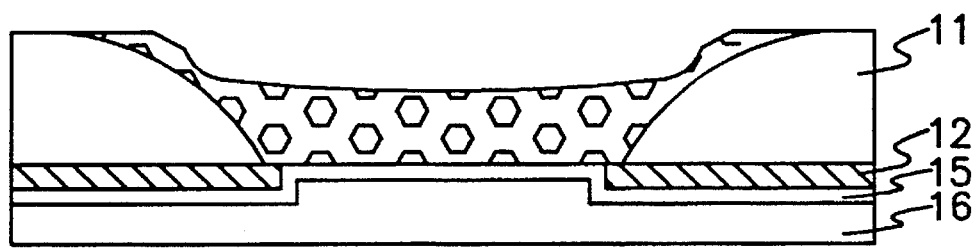

FIG. 3F shows a further porous silicon layer with the application of constant current which comes into direct contact with the window.

Figure 3G:
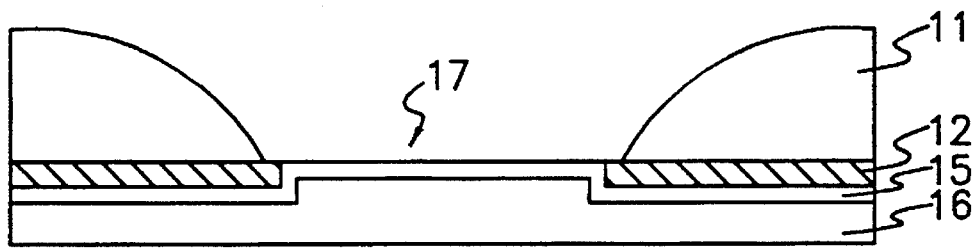

Finally, as shown in FIG. 3G, a hole is formed by the action of the etchant solution, which the window is exposed through.

As apparent from these figures, the hole has an easy descent at its upper portion but a sharp descent at its lower portion, which is due to the difference of etch selectivity with the lapse of time between the lower and upper portions of the silicon substrate.

Since the porous reaction or electropolishing velocity becomes higher with thinner silicon substrate, the constant current to be applied to the system could be gradually reduced to about 100 mA as the porous reaction is advanced.

Typically, the electropolishing of silicon can be accomplished by using a hydrofluoric acid solution. In the present invention, the electropolishing of silicon substrate can be achieved by employing a 17 wt. % hydrofluoric acid solution and a constant current of 3 A. In this case, the silicon substrate is electropolished rather than made to be porous.

With reference to FIGS. 4A through 4E, there is shown an electropolishing method for etching a silicon substrate in self alignment, according to another embodiment of the present invention.

Figure 4A:
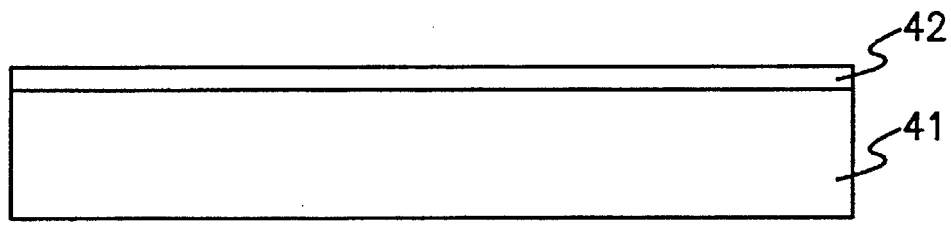
FIGS. 4A through 4E are schematic cross sectional views showing an electropolishing method for etching a silicon substrate in self alignment, according to another embodiment of the present invention.

First, FIG. 4A shows a p type silicon substrate 11 which is covered with an oxide film 42 with a thickness of about 0.5 to 1.5 microns.

Figure 4B:
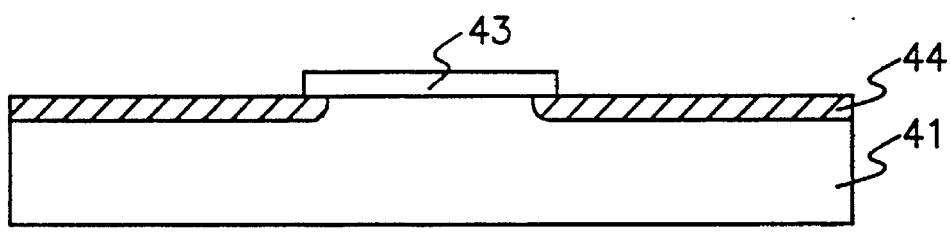

FIG. 4B is a cross section of the silicon substrate after the oxide film 42 is subjected to selective etch, to form an oxide film pattern 43 with a dimension of about 4 mm×4 mm to about 5 mm×5 mm, followed by implantation of impurity into the silicon substrate 41 to form an impurity-doped layer 44 which is about 2000 Angstrom to 2 µm thick. For the impurity-doped layer, phosphorous is used in a dose of about $1\times10^{16}$ to about $5\times10^{21}/cm^3$.

Figure 4C:
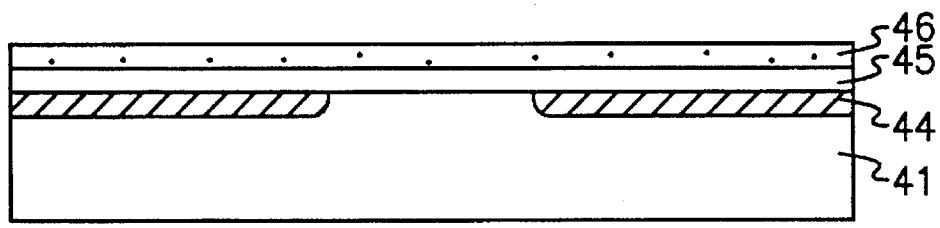

FIG. 4C is a cross section of the silicon substrate after the oxide film pattern 43 is removed, followed by sequential formation of a gold or platinum layer 45 and a sacrificial layer or metal layer 46. The gold or platinum layer 45 is deposited in a thickness of about 1000 to 1500 Angstroms.

Figure 4D:
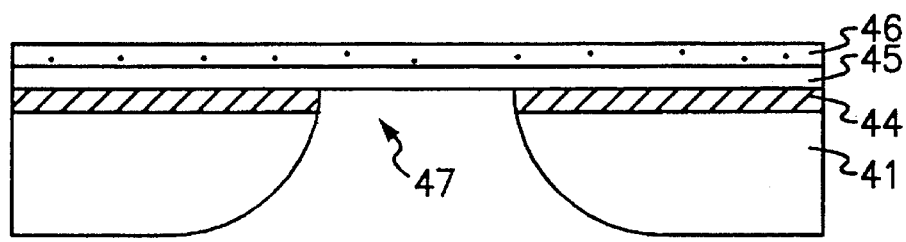

FIG. 4D is a cross section of the silicon substrate after a hole 47 is formed in self-alignment by subjecting the silicon substrate to the electropolishing illustrated in FIG. 2. The constant current does not flow between the phosphorous-doped layer and the silicon substrate as an inverse bias is generated therebetween. By contrast, the current flows only through the area in which the phosphorous-doped layer is omitted and with which the hole is self-aligned.

Figure 4E:
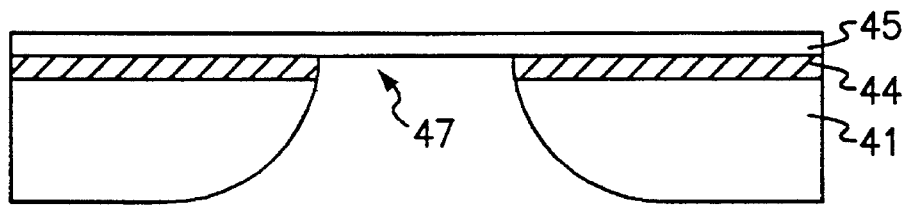

FIG. 4E is a cross section of the silicon substrate after the sacrificial layer 46 is removed, to obtain a gold or platinum membrane.

Likewise, a metal layer is employed instead of the sacrificial layer and then a metal membrane can be obtained by removing the gold or platinum. In this case, the gold or platinum comes to direct contact with the silicon substrate, which leads to increasing mechanical bonding strength between the membrane and the silicon substrate.

Turning now to FIGS. 5A through 5G, there is shown application of the substrate manufactured, according to the present invention for fine pattern.

Figure 5A:
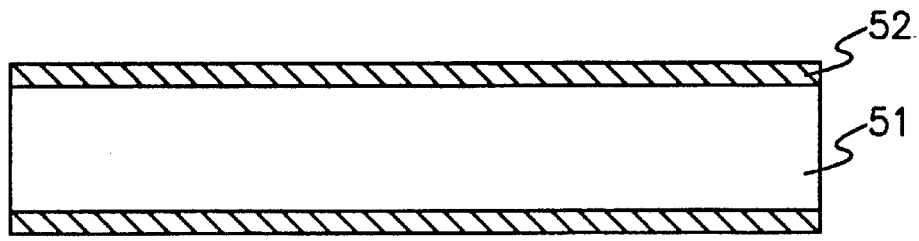
FIGS. 5A through 5G are schematic cross sectional views showing the preferred processes for manufacturing fine patterns by application of the silicon substrate of the present invention.

First, as shown in FIG. 5A, a p type silicon substrate 51 is covered with about 0.03 to 1.5 microns thick insulation layer of oxide 52.

Figure 5B:
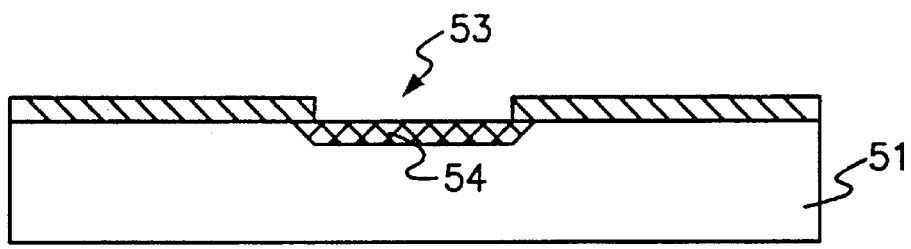

Next, as shown in FIG. 5B, the oxide layer is selectively etched to form a window 53 with a dimension of about 500 microns×2 mm through which a predetermined area of the silicon substrate 51 is exposed and then, boron is doped in the predetermined area to form a boron-doped layer 54 with the remaining oxide layer functioning as a mask.

Figure 5C:
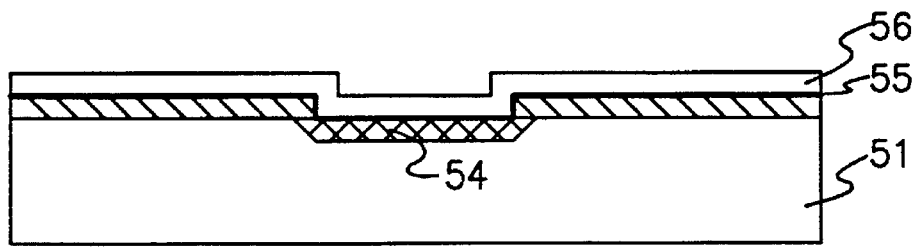

Thereafter, as shown in FIG. 5C, a titanium layer 55 and a gold or platinum layer 56 are, in sequence, deposited over the resulting structure. The titanium layer 55 is about 100 to 300 Angstroms whereas the gold or platinum layer about 1000 to 4000 Angstroms.

Figure 5D:
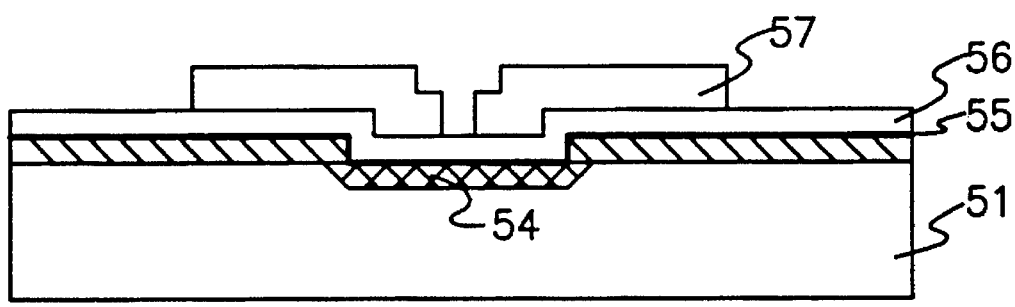
Figure 6A:
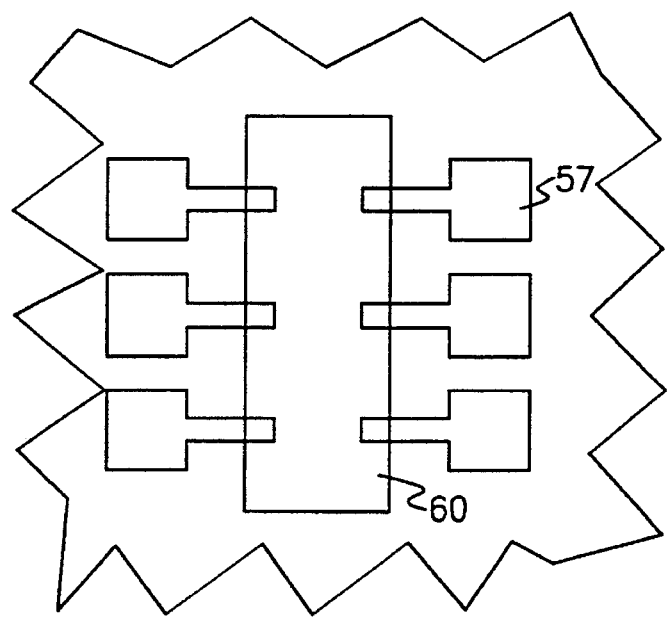
FIG. 6A is a top view showing a plurality of the sacrificial photosensitive film patterns.

Subsequently, as shown in FIG. 5D, a sacrificial photosensitive film pattern 57 with a thickness of about 30 microns, which consists of a regular square with a dimension of 90 microns×90 microns and a rectangle with a dimension of 30 microns×100 microns, both of them being attached to each other, is formed in such a way that the rectangle may be, in part, rested on the window 53. FIG. 6A is a top view showing a plurality of the sacrificial photosensitive film patterns. In this top view, numeral 60 is a hole which will be formed in the subsequent processes.

Figure 5E:
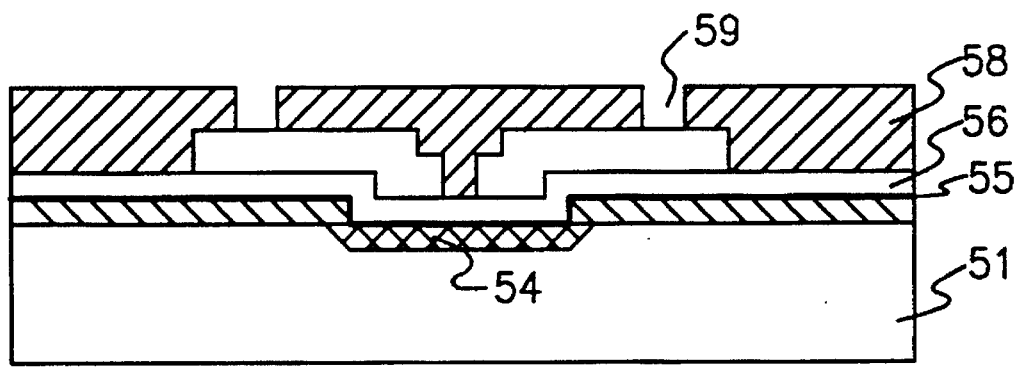

Then, as shown in FIG. 5E, the silicon substrate 51 is electroplated with nickel 58 in a thickness of about 50 to 70 microns, which is then etched to form an opening 59 with a diameter of about 50 microns over the regular square of the sacrificial photosensitive film pattern.

Figure 5F:
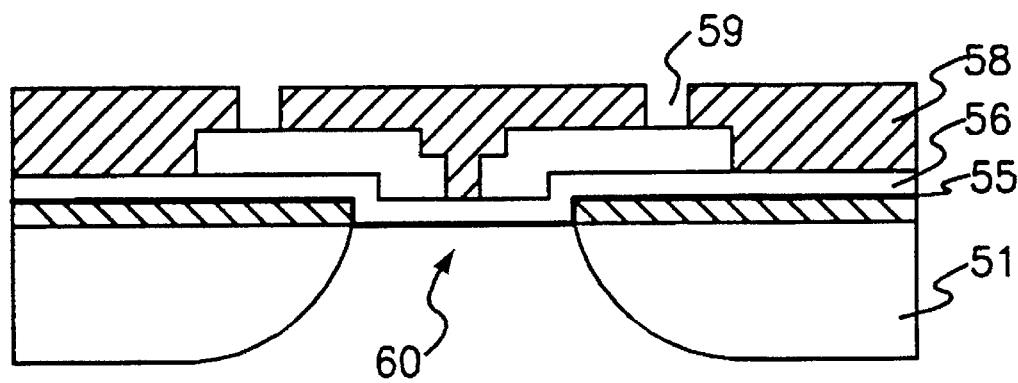

Following the formation of such nickel pattern 58, the silicon substrate is subjected to the electropolishing described in FIG. 2, to form a hole 60 which is self-aligned with the window 53, as shown in FIG. 5F.

Figure 5G:
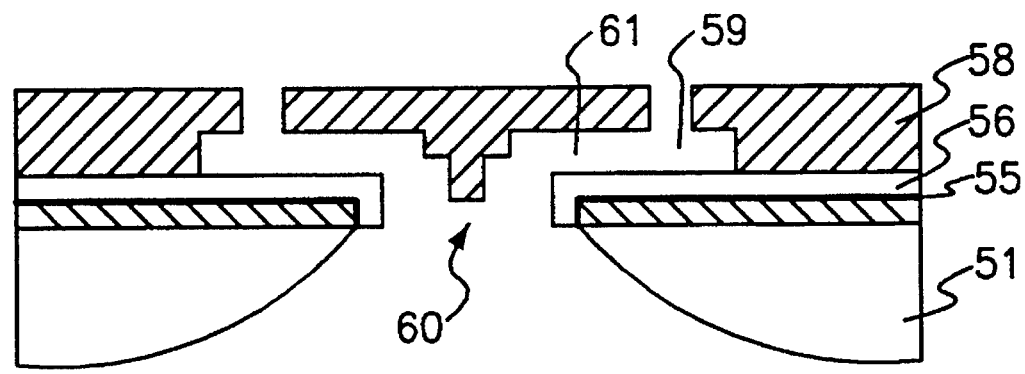
Figure 6B:
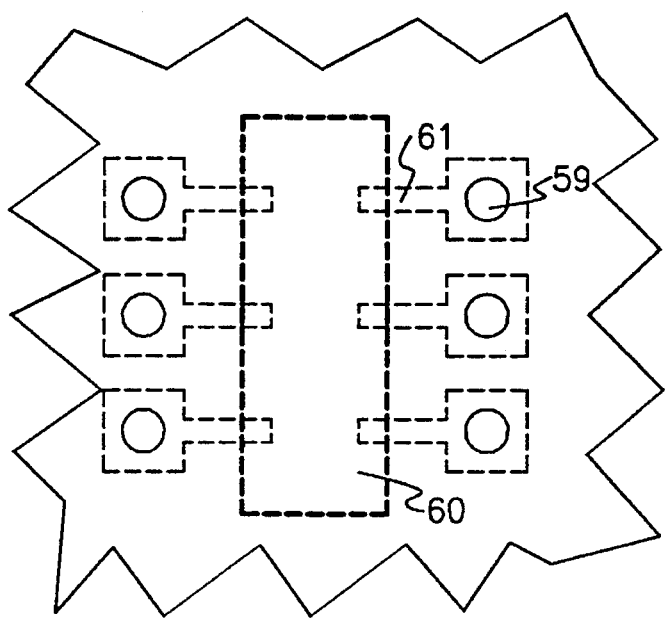
FIG. 6B is a top view of FIG. 5G.

Finally, the titanium layer 55 and the gold or platinum layer 56 within the hole 60 are removed and the photosensitive film pattern 57 is sacrificed, as shown in FIG. 5G. As a result, there is formed a fine hole 61 which is connected with the self-aligned hole 60 and the opening 59. FIG. 6B is a top view of FIG. 5G.

There are brought about many advantages, according to the present invention. Following are of these advantages.

First, the present invention's methods are very economical relative to conventional ones as only cheap chemicals and an ordinary reaction system, including a constant current source, are required.

Second, the upper surface of substrate on which fine structures have been and continue to be formed does not come into contact with the chemicals, so that the fine structures do not suffer mechanical and thermal impact in addition to not being chemically damaged.

Third, since the hole formed in self-alignment is patterned after the form of the electrical contact with the upper surface of the substrate, it can have any form in plane, with ease.

As described hereinbefore, the methods disclosed in the specification are useful to manufacture easily a variety of fine structures at a low cost.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. An electropolishing method for etching a substrate in self alignment, comprising the steps of:

establishing an insulation film pattern by forming an insulation film on a substrate and selectively etching the insulation film, an area of the substrate being exposed through the insulation film pattern;

implanting ions into the area of the substrate, to form an ion-doped layer;

sequentially forming a metal layer and a material layer over the resulting structure;

forming a hole by making an area of the substrate porous in an electropolishing system and etching the porous area, said electropolishing system consisting of a reaction tube, an etchant solution, an electrode, a constant current source, and the silicon substrate, wherein said etchant solution is contained in a space confined by the reaction tube and the substrate, which is attached to one end of the reaction tube in such a way that the bottom of the substrate may be toward the interior of the space, said constant current source being connected with the metal layer of the substrate and the electrode; and eliminating any one of the metal layer and the material layer from the substrate, to obtain a membrane consisting of the other layer thus left.

2. An electropolishing method in accordance with claim 1, wherein said electropolishing system is operated by repeating a procedure that a current is supplied from the constant current source to the electrode and the metal layer for a first period of time and the supply of current is broken for a second period of time.

3. An electropolishing method in accordance with claim 1, wherein said material layer is made of one selected from a group consisting of nickel, chrome, tungsten, titanium, tantalum and copper.

4. An electropolishing method in accordance with claim 1, wherein said material layer is eliminated to obtain a membrane consisting of the metal layer.

5. An electropolishing method in accordance with claim 4, wherein said material layer is made of one selected from a group consisting of photosensitive solution, polymer and paraffin.

6. An electropolishing method in accordance with claim 1, wherein said insulation film is one selected from a group consisting of a silicon oxide film, a silicon nitride film, a silicon carbide film, a photosensitive film and a polymer.

7. An electropolishing method in accordance with claim 1, wherein said substrate is a silicon substrate.

8. An electropolishing method in accordance with claim 1, wherein said ions are of boron or phosphorous.

9. An electropolishing method in accordance with claim 1, wherein said metal layer is made of gold or platinum.

10. An electropolishing method in accordance with claim 7, wherein said etchant solution is a hydrofluoric acid solution or a mixture solution of hydrofluoric acid, nitric acid and water.

11. An electropolishing method in accordance with claim 8, wherein said ions are implanted in a dose of about $1 \times 10^{16}/cm^3$ to about $5 \times 10^{21}/cm^3$.

12. An electropolishing method in accordance with claim 9, wherein said metal layer is about 1000 to about 5000 Angstroms thick.

13. An electropolishing method for etching a substrate in self alignment, comprising the steps of:

establishing a window by forming an insulation film on a substrate and selectively etching the insulation film, an area of the substrate being exposed through the window;

implanting ions into the exposed area of the substrate, to form an ion-doped layer;

sequentially forming a first metal layer and a second metal layer over the resulting structure;

forming a sacrificial layer in such a pattern as to cover the window in part;

forming a third metal layer over the resulting structure;

opening an area of the third metal layer to form an aperture over the pattern of the sacrificial layer;

forming a hole by making an area of the substrate porous in an electropolishing system and etching the porous area in such a way to expose an area of the first metal layer, said electropolishing system consisting of a reaction tube, an etchant solution, an electrode, a constant current source and the silicon substrate, wherein said etchant solution is contained in a space confined by the reaction tube and the substrate, which is attached to one end of the reaction tube in such a way that the bottom of the substrate may be toward the interior of the space, said constant current source being connected with the first and the second metal layers of the substrate and the electrode; and eliminating the exposed area of the first metal layer, the second metal layer within the hole and the sacrificial layer from the substrate, to obtain a membrane consisting of the other layer thus left.

14. An electropolishing method in accordance with claim 13, wherein said electropolishing system is operated by repeating a procedure that a current is supplied from the constant current source to the electrode, and the first and the second metal layers for a first period of time and the supply of current is broken for a second period of time.

15. An electropolishing method in accordance with claim 13, wherein said substrate is a silicon substrate.

16. An electropolishing method in accordance with claim 15, wherein said etchant solution is a hydrofluoric acid solution or a mixture solution of hydrofluoric acid, nitric acid and water.

17. An electropolishing method in accordance with claim 13, wherein said sacrificial layer is made of one selected from a group consisting of photosensitive solutions, polymers, and paraffin.

18. An electropolishing method in accordance with claim 13, wherein said insulation film is one selected from a group consisting of a silicon oxide film, a silicon nitride film, a silicon carbide film, a photosensitive film and a polymer.

19. An electropolishing method in accordance with claim 13, wherein said ions are of boron.

20. An electropolishing method in accordance with claim 19, wherein said ions are implanted in a dose of about $1 \times 10^{16}/cm^3$ to about $5 \times 10^{21}/cm^3$.

21. An electropolishing method in accordance with claim 13, wherein said first metal layer is made of one selected from a group consisting of titanium, nickel, chrome, tantalum and tungsten.

22. An electropolishing method in accordance with claim 21, wherein said first metal layer is about 100 to about 1000 Angstroms thick.

23. An electropolishing method in accordance with claim 21, wherein said third metal layer is about 20 to about 100 Angstroms thick.

24. An electropolishing method in accordance with claim 13, wherein said second metal layer is made of gold or platinum.

25. An electropolishing method in accordance with claim 24, wherein said second metal layer is about 1000 to about Angstroms thick.

26. An electropolishing method in accordance with claim 13, wherein said third metal layer is made of nickel or copper.

* * * * *